United States Patent
Martins

(10) Patent No.: US 12,170,521 B2
(45) Date of Patent: Dec. 17, 2024

(54) COMPARATOR

(71) Applicant: NEXPERIA B.V., Nijmegen (NL)

(72) Inventor: Gustavo Campos Martins, Delft (NL)

(73) Assignee: NEXPERIA B.V., Nijmegen (NL)

( * ) Notice: Subject to any disclaimer, the term of this patent is extended or adjusted under 35 U.S.C. 154(b) by 0 days.

(21) Appl. No.: 17/052,354

(22) PCT Filed: May 1, 2019

(86) PCT No.: PCT/NL2019/050255
§ 371 (c)(1),
(2) Date: Nov. 2, 2020

(87) PCT Pub. No.: WO2019/212343
PCT Pub. Date: Nov. 7, 2019

(65) Prior Publication Data
US 2021/0067151 A1    Mar. 4, 2021

(30) Foreign Application Priority Data

May 1, 2018  (NL) ...................................... 2020856

(51) Int. Cl.
*H03K 5/24* (2006.01)

(52) U.S. Cl.
CPC .................................. *H03K 5/2481* (2013.01)

(58) Field of Classification Search
CPC .... H03K 5/2481; H03K 5/249; H03K 5/2418; H04L 25/0272; H03F 3/45183; H03F 3/45179; H03F 3/45192; H03F 3/45188; H03F 3/45475
USPC .............. 327/63–67, 560–563; 330/252–253
See application file for complete search history.

(56) References Cited

U.S. PATENT DOCUMENTS

| 5,694,033 | A |   | 12/1997 | Wei et al. |
| 5,961,215 | A | * | 10/1999 | Lee .......................... G01K 7/01 374/178 |
| 2003/0025533 | A1 | * | 2/2003 | Akita ................... H03K 5/2481 327/71 |
| 2003/0184927 | A1 | * | 10/2003 | Akita ............... G01R 19/16542 361/5 |
| 2010/0079431 | A1 |   | 4/2010 | Tsai et al. |
| 2011/0210762 | A1 | * | 9/2011 | Hirose ................. H03K 5/2481 327/73 |
| 2013/0194039 | A1 | * | 8/2013 | Hirose ................. H03F 3/3028 330/253 |
| 2014/0043562 | A1 |   | 2/2014 | Kikuchi |
| 2014/0314173 | A1 |   | 10/2014 | Hekmat et al. |

FOREIGN PATENT DOCUMENTS

CN           102709883 B      8/2014

OTHER PUBLICATIONS

International Search Report for PCT/NL2019/050255 dated Aug. 9, 2019, 3 pages.

* cited by examiner

*Primary Examiner* — Quan Tra
(74) *Attorney, Agent, or Firm* — Ruggiero McAllister & McMahon LLC

(57) ABSTRACT

The invention relates to an asynchronous comparator that presents low average power consumption and short propagation delay. The comparator bias current is dependent on the differential input voltage in a way that the current increases when the differential input voltage is low and decreases when the differential input voltage is high.

11 Claims, 2 Drawing Sheets

COMPARATOR

The present disclosure is generally related to a comparator for comparing two different input voltages and for outputting a digital signal which indicates which of the input voltages is larger.

BACKGROUND

A comparator is a device which compares voltages or currents between two separate analog input terminals. The output of the comparator typically exist of one, ideally binary, digital output which for example is high when the first input terminal is higher than the second input terminal, and low if it is the other way round. Comparators may be constructed from discrete components as differential amplifiers with a high-gain and may be used for measuring or digitalizing analogue signals. As such, comparators can be used as analogue-to-digital converters.

Operational amplifiers, or op-amps for short, are widely used in the electronics industry to function as comparators. Comparators typically have a reference signal which is applied to one of the inputs. On the other input a signal is applied which is compared with the reference signal. The output of the comparator may (approximately) equal the positive supply voltage if the voltage of the signal to be compared is less than the magnitude of the reference voltage. An inverted voltage comparator on the other had may be provided by simple transposing the signals at the inverting and the non-inverting inputs.

Comparators may be employed for several types of applications and under certain applications for example, the magnitude of the analogue signal may change rapidly. The comparator should have a quick response time. What that means, is that the comparator must quickly determine whether the magnitude of the analogue signal is greater than, or less than the predetermined reference signal which functions as a threshold. In many applications, it is desirable to provide comparators that operate at high speed. In many applications, it is however also often desirable to provide comparators that can operate under low voltage conditions and with a low power consumption.

Conventional high-speed comparators with op-amps rely on a bias that is provided as the reference signal. For high-speed operation, additional circuitry is often required which is typically employed to generate the bias signal that may increase the speed. The additional circuitry consumes additional area, which in some applications is highly undesirable. As such, there is a trade-off between the space needed by the additional circuitry and the increase in speed of operation of the comparator. As indicated above, operation under low voltage conditions is also challenging and there is also a trade-off between speed of operation of the comparator and the power consumption.

In view of the above, there is a need for high-speed comparators which are able to operate under low voltage conditions with a low amount of circuit components and thus a small footprint.

SUMMARY

It is an object of the present invention to provide a comparator which addresses at least some of the above-mentioned drawback and disadvantages of the prior art.

This object is, in a first aspect of the invention, provided by a comparator, arranged for operation under low average power consumption for comparing a first analogue input signal with a second analogue input signal, said comprising:
 a first differential input stage comprising two input switches forming an input differential pair, for comparison of a transition between said first and second analogue input signals;
 a output stage for providing a digital output of said comparator in accordance with a difference between said first and second analogue input signals;
 a bias current stage for providing a bias current to said differential input stage, characterized in that said bias current stage is provides said bias current in correspondence with said first and second analogue input signals.

Comparators for example used in internet of things, IoT, applications should be optimized for low average power consumption as well as short propagation delays.

Known comparators have what is called a bias currents which is dependent on the differential between the analogue input signals on both inputs of the comparator. If the differential input voltage tends towards zero, the bias current will increase. If the differential input voltage on the other hand is increasing and moving away from zero, the bias current will decrease.

Known comparators may have a bias current which is generated by a transistor which has its gate terminal connected to one of the inputs.

Known comparators have the disadvantage that they cannot be controlled very accurately. Moreover, they have a large variation with variations in the processing. Although adaptive bias comparators present more control over the bias current, they have limitations with respect to the propagation delay and require an external current reference.

The comparator according to a first aspect of the invention however comprises a bias current stage for providing a bias current to the differential input stage of the comparator in which the bias current stage provides the bias current in correspondence with the first and second analogue input signals. Accordingly, there is a feedback from the comparator itself as a feed for the bias current such that no extern current generator is required. Therefor the comparator according to the first aspect of the invention is able to operate under low or ultra low average power consumption.

Typically, propagation delay of the comparator is strongly dependent on the power supply voltage. Increased power supply and higher power consumption has a positive effect in decreasing the propagation delay.

With the comparator according to the first aspect of the invention the propagation delay is also decreased, hence, the comparators output quickly responses to the voltage differential on the input terminals, however without negative effect on the power consumption, i.e. under low or ultra low average power consumption.

With the bias current stage of the comparator according to the first aspect of the invention, the bias current will increase as the voltage differential on the input decreases. This is achieved by having a feedback from the output of the comparator to the current bias stage, in stead of what is known in the prior art, to the input terminals of the comparator.

In a further example, the bias current stage is arranged for increasing the bias current to the differential input stage upon decrease of the transition between the first and second analogue input signals.

The bias current stage may be configured by a single switch such as a transistor which has its source connected to the Vdd and its drain to the sources of the two input switches of the first differential input stage. A feedback from the comparator, i.e. from the output thereof or more specifically from the output of the first or a second differential input stage, is connected to the gate of the bias current stage switch for controlling the bias current.

In a further example, the comparator further comprises:
a further differential input stage comprising two input switches forming a further differential pair connected in parallel with the first differential input stage to the output stage.

In a further example, the comparator further comprises:
a start-up stage, connected in parallel with the first differential input stage to the output stage for starting up the comparator.

The start-up stage may remove the uncertainty of the output upon start-up of the comparator. The output of the comparator may output a certain high or low level upon start-up which is unpredictable but may also transition back and forth between the states regardless of the input. Therefor the output may provide an fall state upon the start-up up until the power supply provides a significant power level to the comparator to function correctly. This is particularly relevant for such a comparator in an application in which the circuit to which the comparator is connected, or even the comparator itself is made powerless or in a sleep mode for some time.

In a further example, the comparator further comprises:
a current mirror stage, connected in series between the start-up stage and the further differential input stage.

The current mirror is formed by two transistors, of the bias current stage in a current mirror configuration with their gates connected to each other. The current mirror feeds back the current to the first differential input stage.

In a further example, the comparator further comprises:
a second differential input stage comprising two input switches forming an second input differential pair, and connected in series between the first differential pair and the output stage.

The second differential input stage, especially for being part of the feedback of the bias current stage, may further decrease the power consumption of the comparator, especially for typical applications of the comparator.

In a further example, the comparator further comprises:
a stability stage, comprising a switch and a resistor and connected between the further differential pair and the second input differential pair.

In a further example, the switches of the comparator are comprised of MOSFETs.

In a further example, the comparator is an asynchronous comparator.

In a second aspect of the invention, there is provided a sensor device comprising:
a sensor, arranged for performing a measurement and arranged for generating an analogue input signal;
a digital control unit, arranged for processing sensor measurement data;
a comparator circuit for converting the analogue input signal of the sensor data to digital sensor measurement data for the digital control unit, and wherein the comparator circuit comprises a comparator in accordance with any of the previous disclosures.

In a third aspect of the invention, there is provided a comparator, arranged for operation under low average power consumption for comparing a first analogue input signal with a second analogue input signal, said comprising:
a first transistor, which provides a bias current to said comparator, said first transistor having a gate connected to a gate and drain of a second transistor and a drain connected to a source of a third and a fourth transistor;
said third and fourth transistor forming a first differential pair, and having gates connected to input nodes of the comparator, and having drains connected to a gate and a source of a fifth and a sixth transistor, respectively, and to an output or second stage of the comparator;
said sixth transistors having a gate and source connected to a gate of a seventh transistor;
said seventh transistor having a drain connected to said source and gate of said second transistor.

In a further example, the comparator further comprises:
a first resistive element connected to the source of the seventh transistor.

In a further example, the comparator further comprises: an eighth and ninth transistor having sources connected together to the drain of the seventh transistor.

In a further example, the comparator further comprises:
a tenth transistor having a gate and drain connected together to the drain of the ninth transistor.

The above-mentioned and other features and advantages of the disclosure will be best understood from the following description referring to the attached drawings. In the drawings, like reference numerals denote identical parts or parts performing an identical or comparable function or operation.

DETAILED DESCRIPTION OF THE DRAWINGS

Figure 1:
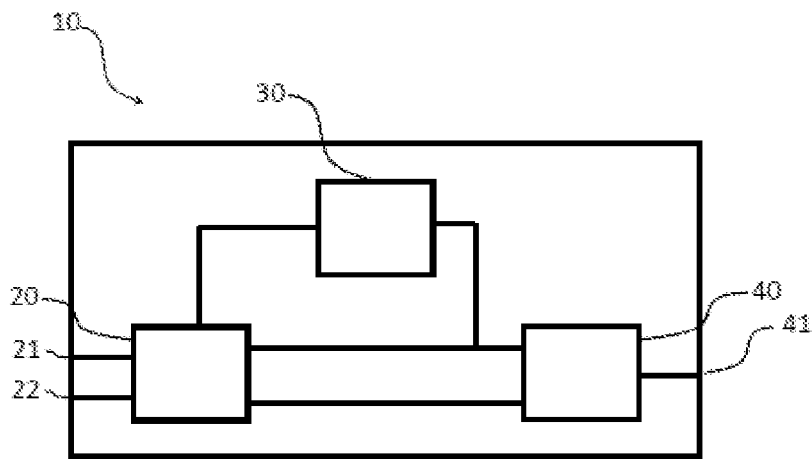
FIG. 1 schematically depicts an adaptive self-bias comparator according to an aspect of the invention.

FIG. 1 schematically depicts a comparator according to a first aspect of the invention. The comparators is arranged to operation under low average power consumption in comparison with comparators known in the art, which draw a non-negligible amount of power during the non-active stage. The comparator according to the present invention has a lower average power consumption which has the characteristic of decreasing power consumption in case the first input signal moves away from the second, i.e. reference, signal and may increase in power consumption in case the first input signal mores more towards the second reference signal, such that power consumption is reduced when the input is less-critical and (relatively) increased when the input becomes more critical for approaching the reference and a change of output is desired.

The comparator 10 a comprises an input stage 20, output stage 40 and a bias current stage, but may comprise additional components.

The first differential input stage 20 comprises two input switches forming an input differential pair 20, for comparison of a transition between said first 21 and second 22 analogue input signals. The output stage 40 of the comparator 10 is arranged for providing a digital output 41 of the comparator 10 in accordance with a difference between said first 21 and second 22 analogue input signals. The comparator also comprises a feedback 30 in the form of a bias current stage 30 which provides a bias current to the differential input stage 20 which is in correspondence with the first 21, and preferably also the second 22 analogue input signal.

Figure 2:
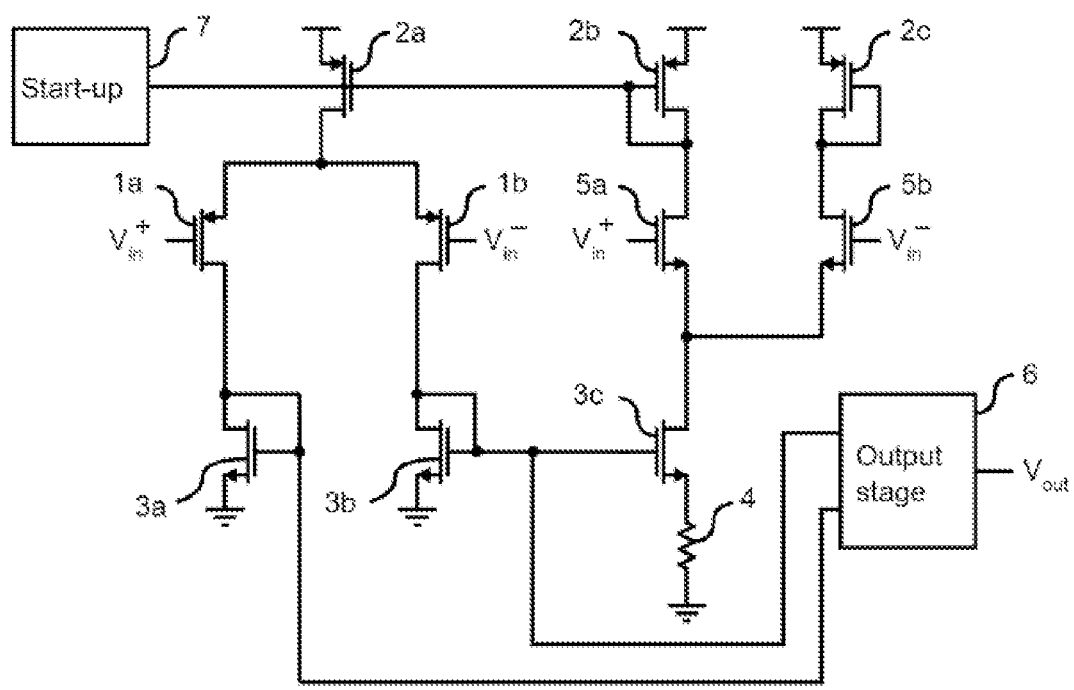
FIG. 2 schematically depicts an embodiment of adaptive self-bias comparator according to an aspect of the invention.

FIG. 2 schematically depicts a comparator according to the first aspect of the invention. The comparator is arranged for operation under low average power consumption for comparing a first analogue input signal with a second analogue input signal, for example for comparing an input (voltage) of an internet of things sensor device or wireless sensor node with a predetermined threshold value (voltage).

The comparator 10 comprises a first differential input stage 12 which is comprising two input switches 12a, 12b, forming an input differential pair 12a, 12b, for comparison of a transition between the first 11a and second 11b analogue input signals. The comparator 10 further comprise an output stage 13 for providing a digital output 13a of the comparator 10 in accordance with a difference between the first 11a and second analogue input signals 11b. The comparator further comprises a bias current stage 14 for providing a bias current 14a to said differential input stage. The bias current stage of the comparator 10 provides the bias current 14 in correspondence with the first and second analogue input signals 11a, 11b.

FIG. 2 schematically depicts the adaptive self-biased comparator. Transistor 2a provides the bias current to the comparator. The differential pair 1a-1b compares the two input voltages, connected to the gates of transistors 1a-1b. The currents that flow through 1a and 1b flow through 3a and 3b, respectively. The voltages on the drain of transistors 3a-3b are used by an output stage 6 to generate the output of the comparator. The drain of transistor 3b is connected to the gate of transistor 3c. The resistor 4 is connected to the source of transistor 3c. An additional differential pair formed by transistors 5a-5b is depicted in FIG. 2, but is not strictly necessary. It may decrease the power consumption in some cases. The current mirror formed by transistors 2a-2b feedbacks the current to the differential pair formed by transistors 1a-1b. The ratio between transistors 2a and 2b may assume any value. The resistor 4 is necessary to keep the circuit stable for any value of the ratio between transistors 2a and 2b. Transistor 2c is used to keep the symmetry when the differential pair formed by transistors 5a-5b is employed. The start-up circuit 7 may be necessary to start-up the comparator and may be activated at least once.

Figure 3:
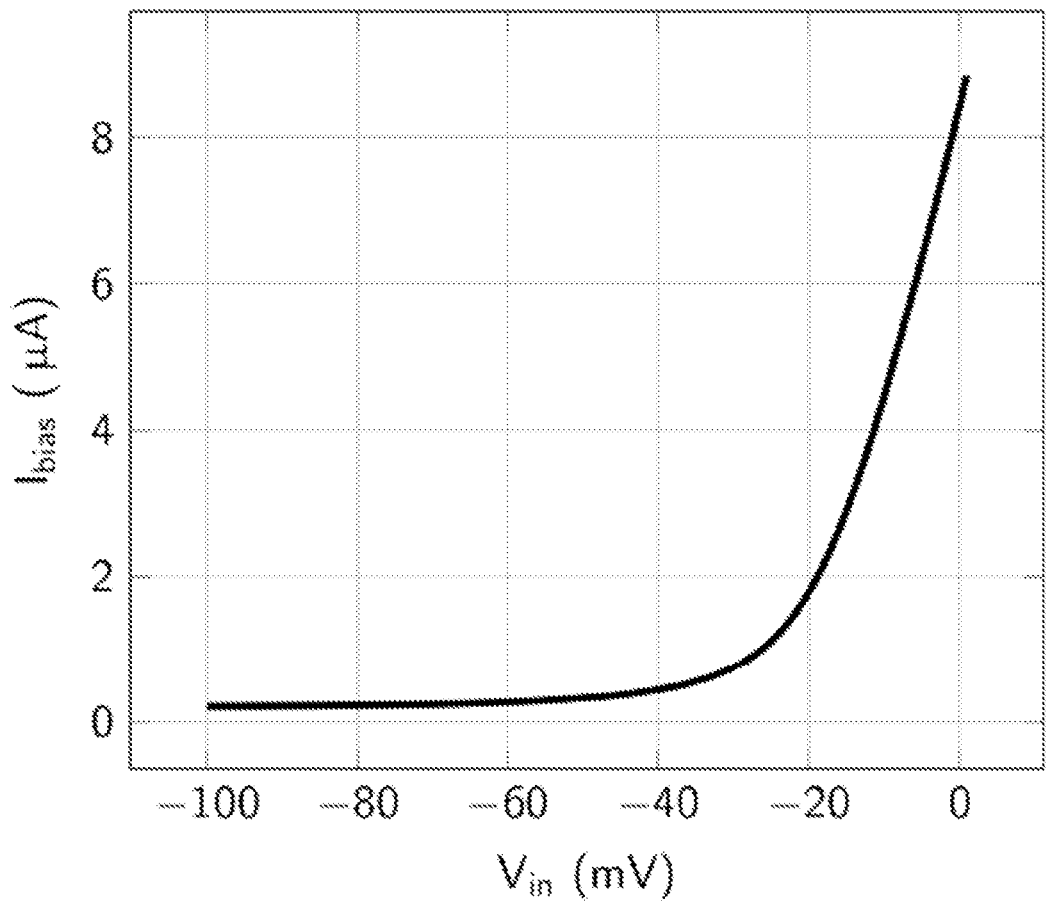
FIG. 3 shows the bias current of the comparator with respect to the differential input voltage.

FIG. 3 presents the expected bias current of the comparator with respect to the differential input voltage, for arbitrary values of components. Although the invention has been described by reference to specific embodiments, it will be apparent to the skilled person that the invention is not limited to these specific embodiments and that the scope of the invention is determined by the appended claims.

Expressions such as "comprise", "include", "incorporate", "contain", "is" and "have" are to be construed in a non-exclusive manner when interpreting the description and its associated claims, namely construed to allow for other items or components which are not explicitly defined also to be present. Reference to the singular is also to be construed in be a reference to the plural and vice versa.

Furthermore, the invention may also be embodied with less components than provided in the embodiments described here, wherein one component carries out multiple functions. Just as well may the invention be embodied using more elements than depicted in the Figures, wherein functions carried out by one component in the embodiment provided are distributed over multiple components.

A person skilled in the art will readily appreciate that the stages of the comparator comprise switches and that these switches can be embodied by several types of switches known in the art, such as but not limited to transistors, field-effect transistors, MOSFET, NMOS, etc.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single stage of the circuit or other unit may fulfil the functions of several items recited in the claims. The mere fact that certain measures are recited in mutually different dependent claims does not indicate that a combination of these measured cannot be used to advantage. Any reference signs in the claims should not be construed as limiting the scope thereof.

The invention claimed is:

1. A comparator arranged for operation under low average power consumption for comparing a first analogue input signal with a second analogue input signal, the comparator comprising:
   a differential input stage comprising two input switches forming an input differential pair, for comparison of a transition between said first and second analogue input signals;
   an output stage for providing a digital output of the comparator in accordance with a difference between said first and second analogue input signals;
   a further differential input stage comprising two input switches forming a further input differential pair between said input differential pair and said output stage;
   a bias current stage for providing a bias current to said differential input stage, wherein said bias current stage provides said bias current in correspondence with said first and second analogue input signals, wherein said bias current stage is configured by a single switch that includes a transistor;
   a current mirror stage, formed by said transistor of said bias current stage and another transistor connected to said differential input stage; and
   a stability stage comprising a switch and a resistor and connected between said further input differential pair and said input differential pair.

2. The comparator according to claim 1, wherein said bias current stage is arranged for increasing said bias current to said differential input stage upon decrease of said transition between said first and second analogue input signals.

3. The comparator according to claim 1, wherein
   a said further input differential pair of said further differential input stage being connected in parallel with said differential input stage to said output stage.

4. The comparator according to claim 1, further comprising:
   a start-up stage connected in parallel with said differential input stage to said output stage for starting up the comparator.

5. The comparator according to claim 4, wherein
   said current mirror stage is connected in parallel with said start-up stage and in series with said further differential input stage.

6. The comparator according to claim 1, wherein the comparator has switches that are comprised of MOSFETs.

7. The comparator according to claim 1, wherein the comparator is an asynchronous comparator.

8. A sensor device comprising:
   a sensor arranged for performing a measurement and arranged for generating an analogue input signal;
   a digital control unit arranged for processing sensor measurement data;

a comparator circuit for converting said analogue input signal of said sensor data to digital sensor measurement data for said digital control unit, wherein said comparator circuit comprises a comparator arranged for operation under low average power consumption for comparing a first analogue input signal with a second analogue input signal, said comparator comprising:

a differential input stage comprising two input switches forming an input differential pair for comparison of a transition between said first and second analogue input signals;

an output stage for providing a digital output of said comparator in accordance with a difference between said first and second analogue input signals;

a further differential input state comprising two input switches forming a further input differential pair between said input differential pair and said output stage a bias current stage for providing a bias current to said differential input stage, wherein said bias current stage provides said bias current in correspondence with said first and second analogue input signals, and wherein said bias current stage is configured by a single switch that includes a transistor;

a current mirror stage, formed by said transistor of said bias current stage and another transistor connected to said differential input stage; and a stability stage comprising a switch and a resistor and connected between said further input differential pair and said input differential pair.

9. A comparator arranged for operation under low average power consumption for comparing a first analogue input signal with a second analogue input signal, the comparator comprising:

a first transistor for a bias current stage, which provides a bias current to the comparator, said first transistor having a gate connected to a gate and drain of a second transistor to form a current mirror and a drain connected to a source of a third and a fourth transistor;

said third and fourth transistor forming a first differential pair input stage, and having gates connected to input nodes of the comparator, and having drains connected to a gate and a drain of a fifth and a sixth transistor, respectively, and to an output or second stage of the comparator;

said sixth transistor having a gate and drain connected to a gate of a seventh transistor;

said seventh transistor having a drain connected to said drain and gate of said second transistor; and an eighth and a ninth transistor forming a further differential input pair, the eighth and the ninth transistor each having sources connected together to the drain of said seventh transistor.

10. The comparator according to claim 9, further comprising:

a first resistive element connected to a source of said seventh transistor.

11. The comparator according to claim 9, further comprising:

a tenth transistor having a gate and drain connected together to said drain of said ninth transistor.

* * * * *